(12) United States Patent
Juhasz et al.

(10) Patent No.: US 11,765,859 B2
(45) Date of Patent: Sep. 19, 2023

(54) METHODS OF IMMERSION COOLING WITH LOW-GWP FLUIDS IN IMMERSION COOLING SYSTEMS

(71) Applicant: THE CHEMOURS COMPANY FC, LLC, Wilmington, DE (US)

(72) Inventors: Jason R. Juhasz, Hockessin, DE (US); Drew Richard Brandt, West Chester, PA (US); Luke David Simoni, Wilmington, DE (US); Jonathan P. Stehman, Wilmington, DE (US); Viacheslav A. Petrov, Hockessin, DE (US); Gustavo Pottker, Chesterbrook, PA (US)

(73) Assignee: THE CHEMOURS COMPANY FC, LLC, Wilmington, DE (US)

( * ) Notice: Subject to any disclaimer, the term of this patent is extended or adjusted under 35 U.S.C. 154(b) by 0 days.

(21) Appl. No.: 17/956,312

(22) Filed: Sep. 29, 2022

(65) Prior Publication Data

US 2023/0112841 A1    Apr. 13, 2023

Related U.S. Application Data

(60) Provisional application No. 63/254,863, filed on Oct. 12, 2021.

(51) Int. Cl.
*H05K 7/20* (2006.01)
(52) U.S. Cl.
CPC ......... *H05K 7/203* (2013.01); *H05K 7/20318* (2013.01)

(58) Field of Classification Search
CPC ............... H05K 7/203; H05K 7/20236; H05K 7/20318; H05K 5/067; H05K 7/208; C10N 2040/16; C09K 5/10
USPC ................................ 361/700, 327, 315, 699
See application file for complete search history.

(56) References Cited

U.S. PATENT DOCUMENTS

| 8,222,195 | B2 | 7/2012 | Minor et al. | |
|---|---|---|---|---|
| 2015/0062806 | A1* | 3/2015 | Shelnutt | H05K 7/20318 361/679.53 |
| 2015/0070846 | A1* | 3/2015 | Shelnutt | H05K 7/20809 361/699 |
| 2016/0137895 | A1* | 5/2016 | Kontomaris | F25B 13/00 252/68 |

(Continued)

FOREIGN PATENT DOCUMENTS

| AU | 2015202652 B2 | 11/2016 |
|---|---|---|
| WO | 2018172919 A1 | 9/2018 |
| WO | 2021119078 A1 | 6/2021 |

*Primary Examiner* — Mandeep S Buttar

(57) ABSTRACT

Disclosed is an immersion cooling unit including an immersion cell, defining an internal cavity. An electrical component is positioned in the internal cavity. A dielectric working fluid partially fills the internal cavity and at least partially immerses the electrical component. A condensing coil is positioned above the dielectric working fluid. The dielectric working fluid comprises at least one of 1,1,1,2,2,5,5,6,6,6-decafluoro-3-hexene, (HFO-153-10mczz), or 1,1,1,4,5,5,5-heptafluoro-4-trifluoromethyl-2-pentene, (HFO-153-10mzzy). Also disclosed is a method of cooling an electrical component, comprising partially immersing an electrical component in a working fluid; and transferring heat from the electrical component using the working fluid.

20 Claims, 3 Drawing Sheets

(56) References Cited

U.S. PATENT DOCUMENTS

| | | | |
|---|---|---|---|
| 2016/0234970 A1* | 8/2016 | Shelnutt | H05K 7/203 |
| 2020/0178414 A1* | 6/2020 | Bulinski | C09K 5/10 |
| 2020/0205318 A1 | 6/2020 | Hulse et al. | |
| 2022/0169902 A1* | 6/2022 | Minor | F25B 45/00 |
| 2022/0187023 A1* | 6/2022 | Kang | F28D 1/0226 |
| 2022/0225528 A1* | 7/2022 | Chen | H05K 7/203 |
| 2022/0248564 A1* | 8/2022 | Moon | G06F 1/20 |
| 2022/0312641 A1* | 9/2022 | Wu | H05K 7/203 |
| 2022/0338376 A1* | 10/2022 | Tan | H05K 7/20318 |
| 2022/0369493 A1* | 11/2022 | Alissa | H05K 7/20836 |
| 2022/0388929 A1* | 12/2022 | Petrov | H01M 10/6567 |
| 2022/0400585 A1* | 12/2022 | Gao | H05K 7/20327 |
| 2022/0408612 A1* | 12/2022 | Peterson | H05K 7/20327 |

\* cited by examiner

Typical boiling curve for water at 1 atm: surface heat flux $q_s''$, as a function of excess temperature, $\Delta T_e \equiv T_s - T_{sat}$.

METHODS OF IMMERSION COOLING WITH LOW-GWP FLUIDS IN IMMERSION COOLING SYSTEMS

CROSS REFERENCE TO RELATED APPLICATIONS

This application claims priority of U.S. Provisional Application No. 63/254,863 filed Oct. 12, 2021, the disclosure of which are incorporated herein by reference in its entirety.

FIELD

The present invention is directed to particular hydrofluoroolefins useful as dielectric working fluids for immersion cooling.

BACKGROUND

A growing public awareness of the environmental impacts from the extraction, transportation and use of fossil fuels are motivating a new environmental sustainability driver in the form of regulations and reduction in output of CO2 equivalence in the atmosphere. New working fluids with low global warming potentials (GWP) and ODP for both existing and new applications in thermal management segments will need to adhere to these new regulations.

The applications opportunities for these new proposed working fluids exist in cooling electronic or electrical heat sources such as high-capacity energy storage devices, power electronics (TVs, cell phones, monitors, drones) battery thermal management (automotive and stationary), e-powertrain, IGBT, computer server systems, computer chips, 5G network devices, displays. Working fluids provide the medium to transport heat or in passive evaporative cooling such as heat pipes. Key factors to consider regarding the compatible use of these fluids include dielectric constant, dissipation factor or loss tangent, volume resistivity, dielectric strength and being non-flammable. These factors provide for an envelope in which fluids in direct contact with electrically charged systems must exist to be non-conductive fluids. The molecules should also have structural properties that make it non-flammable, low GWP, and short atmospheric lifetime, i.e. a double bond. Below, we've identified several molecules and their chemical structures of fluoroolefins (FOs) which meet all these requirements and meet the needs identified for this market.

Applications where this solution can be employed include the cooling of high-capacity energy storage devices, electronic devices, datacenter servers, insulated-gate bipolar transistor (IGBT) devices, telecommunication infrastructure, military electronics, televisions (TVs), cell phones, monitors, drones, automotive batteries, powertrains for electric vehicles (EVs), power electronics, avionics devices, power devices and displays. In some applications, such as batteries, this working fluid can temporarily act as heating fluids, for instance during cold weather start-up. The invention's technical objective is to provide novel specialty fluids for thermal management, with close to ambient and slightly elevated boiling temperature ranges, where these products are environmentally friendly (low GWP and ODP), non-flammable, non-conductive and have low liquid viscosities.

SUMMARY

In one embodiment, an immersion cooling unit including an immersion cell, defining an internal cavity, is provided. An electronic or electrical component is positioned in the internal cavity. A dielectric working fluid partially fills the internal cavity and at least partially immerses the heat generating electronic or electrical device. A condensing coil is positioned inside the cavity above the dielectric working fluid. In another embodiment, the condensing coil is placed outside the cavity and the dielectric fluid circulates out of the cavity through pipe connections to a condenser, then through a pump, to an optional liquid receiver before returning to the cavity to complete the loop. The dielectric working fluid comprises at least one of 1,1,1,2,2,5,5,6,6,6-decafluoro-3-hexene, (HFO-153-10mczz) and 1,1,1,4,5,5,5-heptafluoro-4-trifluoromethyl-2-pentene, (HFO-153-10mzzy). In another embodiment, the working fluid consists essentially of at least one of 1,1,1,2,2,5,5,6,6,6-decafluoro-3-hexene, (HFO-153-10mczz) and 1,1,1,4,5,5,5-heptafluoro-4-trifluoromethyl-2-pentene, (HFO-153-10mzzy).

In another embodiment, a method for cooling an electrical component selected from a computer server system or an energy storage device is provided. The method includes at least partially immersing the electrical component in a working fluid; and transferring heat from the electrical component using the working fluid; wherein the working fluid comprises at least one of 1,1,1,2,2,5,5,6,6,6-decafluoro-3-hexene, (HFO-153-10mczz) and 1,1,1,4,5,5,5-heptafluoro-4-trifluoromethyl-2-pentene, (HFO-153-10mzzy). In another embodiment, the working fluid consists essentially of at least one of 1,1,1,2,2,5,5,6,6,6-decafluoro-3-hexene, (HFO-153-10mczz) and 1,1,1,4,5,5,5-heptafluoro-4-trifluoromethyl-2-pentene, (HFO-153-10mzzy).

In another embodiment, a method of replacing a high GWP working fluid with a working fluid which comprises at least one of 1,1,1,2,2,5,5,6,6,6-decafluoro-3-hexene, (HFO-153-10mczz) and 1,1,1,4,5,5,5-heptafluoro-4-trifluoromethyl-2-pentene, (HFO-153-10mzzy) is provided.

Other features and advantages of the present invention will be apparent from the following more detailed description, taken in conjunction with the accompanying drawings which illustrate, by way of example, the principles of the invention.

BRIEF DESCRIPTION OF THE DRAWINGS

Wherever possible, the same reference numbers will be used throughout the drawings to represent the same parts.

DETAILED DESCRIPTION

Figure 1:
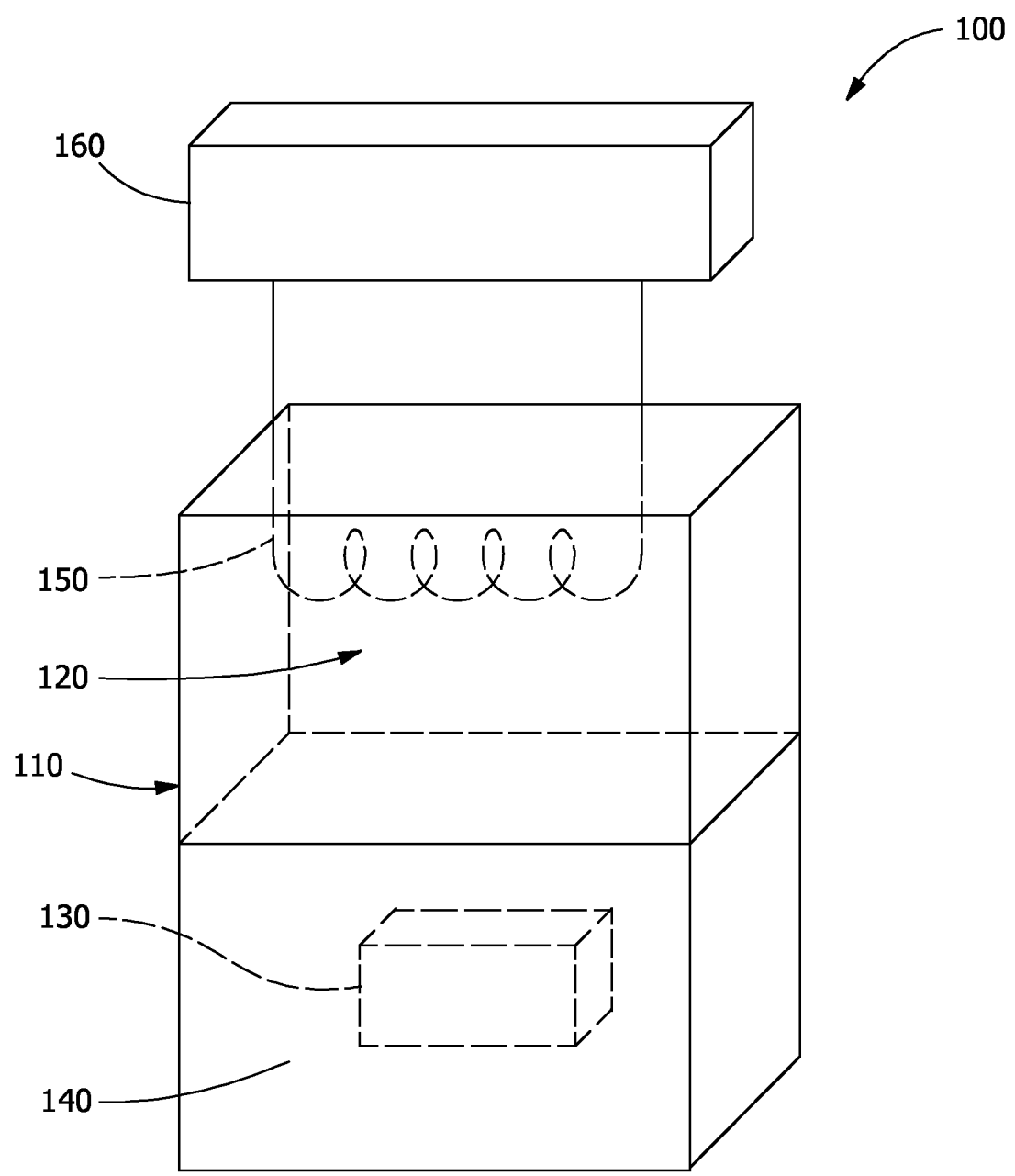
FIG. 1 is a perspective view of an immersion unit, according to an embodiment.

Large scale computer server systems can perform significant workloads and generate a large amount of heat during their operation. A significant portion of the heat is generated from their operation. Due in part to the amount of heat generated, these systems are typically mounted in stacked configurations with large internal cooling fans and heat dissipating fins. As the size and density of these systems increases the thermal challenges are even greater, and eventually outpace the ability for forced air systems.

Two-phase immersion cooling is an emerging cooling technology for the high-performance cooling market as applied to high performance server systems. It relies on the heat absorbed in the process of vaporizing a liquid immersion fluid to a gas. The fluids used in this application must meet certain requirements to be viable in use. For example, the boiling temperature of the fluid should be in the range between 30-75° C. Generally, this range accommodates maintaining the server components at a sufficiently cool temperature while allowing generated heat to be dissipated sufficiently to an external heat sink. Alternatively, the operating temperature of the server, and the immersion cooling system could be raised or lowered, by using an enclosed system and raising or lowering the pressure within the system to raise or lower the boiling point of a given fluid.

Single phase immersion cooling has a long history in computer server cooling. There is no phase change in single phase immersion cooling. Instead, the liquid warms as it circulates through the computer server and or heat exchanger, and then is circulated with a pump to a heat exchanger for cooling prior to returning to the server, thus transferring heat away from the computer server. Fluids used for single phase immersion cooling typically have similar requirements as those for two-phase immersion cooling, except that the boiling temperatures are typically higher than 30-75° C., to reduce loss by evaporation.

Provided is an immersion cooler having an operating temperature range near ambient temperatures. Embodiments of the present disclosure, for example, in comparison to concepts failing to include one or more of the features disclosed herein, provide an immersion cooler having fluids for thermal management which are environmentally friendly (i.e., have a low global warming potential (GWP) and low ozone depletion potential (ODP)).

Also provided is a method of immersion cooling wherein the device is a heat generating component, comprising at least partially immersing the heat generating component into the immersion cooling fluid in a liquid state, and transferring heat from the heat generating component using the immersion cooling fluid. Such devices include high-capacity energy storage devices, electrical or electronic components, mechanical components and optical components. Examples of devices of the present disclosure include, but are not limited to, microprocessors, wafers used to manufacture semiconductor devices, power control semiconductors, electrical distribution switch gear, power electronics and transformers, circuit boards, multi-chip modules, packaged and unpackaged semiconductor devices, lasers, fuel cells, electrochemical cells and energy storage devices such as batteries.

In certain embodiments, the devices can include electronic devices, such as processors, including microprocessors. Microprocessors typically have maximum operating temperatures of about 85° C., so effective heat transfer is required in conditions of high processing power, i.e. high heat rejection rates. In other embodiments, the devices may include energy storage systems, such as batteries. When rapidly charged or discharged, batteries can reject a significant amount of heat that needs to be effectively removed to avoid overheating, internal damage, thermal runaway to adjacent batteries and potentially fire. As these electronic and electric devices become denser, and more powerful, the amount heat generated per unit of time and volume increases. Therefore, the mechanism of heat transfer plays an important role in processor performance. The heat transfer fluid typically has good heat transfer performance, good electrical compatibility (even if used in "indirect contact" applications such as those employing cold plates), as well as low toxicity, low or nonflammability and low environmental impact. Good electrical compatibility suggests that the heat-transfer fluid candidate exhibit high dielectric strength, high volume resistivity, low dissipation factor, low dielectric constant and poor solvency for polar materials. Additionally, the heat-transfer fluid should exhibit good material compatibility, that is, it should not affect typical materials of construction in an adverse manner.

It is generally understood that perfluorinated liquids such as Fluoroinert FC-72 and FC-3284 may exhibit excellent dielectric properties such as dielectric constants of 2.0 or less, high volume resistivity on the order of $10^{15}$ ohm-cm and high dielectric strength. However, these fluids are also generally associated with a high GWP, well outside the current requirements for many industrial applications. The GWP of Fluorinert FC-72 is reported to be >9000. Hydrofluoroethers (HFEs) have lower GWP's but are still not satisfactory and typically have poorer dielectric properties compared to FC-72 and FC-3284. Novec 7100 for example has a GWP of 297. Therefore, there continues to be a need for working fluids for immersion cooling that satisfy the dielectric applications of the industry while having a GWP below current requirements for the industry, which are typically less than 150. In another embodiment, the GWP of a working fluid is less than 100. In another embodiment, the compositions disclosed have a Global Warming Potential (GWP) of not greater than 50. As used herein, "GWP" is measured relative to that of carbon dioxide and over a 100-year time horizon, as defined in "The Scientific Assessment of Ozone Depletion, 2002, a report of the World Meteorological Association's Global Ozone Research and Monitoring Project,".

It is highly desirable that the new fluids have equivalent or superior heat transfer properties, including electronic surface-to-fluid thermal resistance, critical heat flux and fluid-to-condenser thermal resistance, compared to higher GWP existing fluids such as FC-72, FC-3284, Novec-7100, Novec-7000 so that they can replace these fluids in existing systems without significant loss in thermal performance or mechanical modifications, and in new systems designed for FC-72, FC-3284, Novec-7100, without significant mechanical design changes. The practice of replacing an existing fluid with a new fluid in an existing system is often called "retrofit".

It is also desirable that these fluids have similar normal boiling points compared to high GWP fluids such as FC-72, FC-3284, Novec-7100, so that they can be used to replace these in existing systems without significant mechanical or operational changes and in new systems without significant mechanical design changes.

It is also highly desirable that the new fluids provide at least minimum dielectric properties required by the application, or even superior dielectric properties compared to existing fluids such as such as FC-72, FC-3284, HFE-7100 so that they can replace these fluids in existing systems without significant electrical or mechanical modifications, and in new systems designed for FC-72, FC-3284, Novec-7100, Novec-7000 without significant electrical or mechanical design changes. The desirable dielectric properties include high volume resistivity, low dielectric constant, high dielectric strength and low loss tangent.

An embodiment of an immersion cooling unit 100 is shown in FIG. 1. The immersion cooling system 100 includes an immersion cell 110 defining an internal cavity 120. An energy storage device 130, to be cooled, may be placed in the internal cavity 120. A dielectric working fluid 140 partially fills the internal cavity 120. The dielectric working fluid 140 at least partially immerses the energy storage device 130. In some embodiments, the dielectric working fluid 140 substantially immerses the energy storage device 130. In one embodiment, the dielectric working fluid 140 completely immerses the energy storage device 130. A condensing coil 150 is additionally present in the internal cavity 120. The condensing coil 150 may be spatially located above at least a portion of the dielectric working fluid 140.

During operation, heat generated by the electrical component 130, heats the dielectric working fluid 140 causing a portion of the dielectric working fluid 140 to vaporize. The dielectric working fluid 140 vapors contact the condensing coil 150 above the dielectric working fluid 140 and transfer thermal energy to the condensing coil 150 allowing the condensate dielectric working fluid 140 to precipitate back into the liquid dielectric working fluid 140 below. The thermal energy transferred to the condensing coil 150 is transported external to the immersion cell 110 and released into the environment or to a chiller via a heat exchanger 160. The thermal energy released can also be recovered and used for heating applications or for energy generation such as Rankine cycles.

The dielectric working fluids of the immersion cooler 100 are selected to undergo a phase transition from the liquid to the gaseous state over the operational temperature range of the immersion cooler 100. In some embodiments, the composition of the dielectric working fluids 140 includes one or more fluorinated compounds. In some embodiments, the dielectric working fluids 140 include one or more compounds including both fluorine and chlorine. In some embodiments, the operational temperature is at least 25° C., at least 30° C., at least 40° C., at least 50° C., at least 60° C., less than 100° C., less than 90° C., less than 80° C., less than 70° C., less than 60° C., and combinations thereof.

In one embodiment the normal boiling point of the new low-GWP dielectric fluid may be within at least 10° C. of the fluid being replaced. In another embodiment the normal boiling point of the new low-GWP dielectric fluid may be within 6° C. In yet another embodiment, the normal boiling point of the new low-GWP dielectric fluid may be within 2° C.

The dielectric working fluids 140 may also be selected to exhibit a dielectric constant, volume resistivity, dielectric strength and loss tangent (dissipation factor) suitable for direct contact with electrical components. In general, materials exhibiting a low dielectric constant, low loss tangent or dissipation factor, high volume resistivity and large dielectric strength provide increased electrical insulation of the energy storage device, or electrically charged components, 130, immersed therein as well as reduced signal loss. In some embodiments, the dielectric constant of the dielectric working fluids 140 is less than about 8 over the operational frequency range (which can go as high as 100 GHz). Suitable dielectric working fluids include compounds and mixtures having a dielectric constant over the operational frequency range (up to about 100 GHz) of less than 2.5, or less than 2.0, or less than 1.9. Other embodiments include compounds and mixtures having a dielectric constant greater than 1.0 and less than 3.0 or greater than 1.5 and less than 2.5.

In one embodiment, the dielectric constant of the new fluid is no more than 10% higher than that of the incumbent fluid. In another embodiment, the dielectric constant of the new fluid is no more than 20% higher than that of the incumbent fluid. In yet another embodiment, the dielectric constant of the new low GWP fluid is no more than 50% higher than that of the incumbent fluid, even at high frequencies up to about 60 GHz or as high as 100 GHz.

In one embodiment, the volume resistivity of the new fluid is no more than one order of magnitude lower than that of the incumbent fluid (FC-72, FC-3284, Novec 649). In another embodiment, the volume resistivity of the new fluid is no more than two orders of magnitude lower than that of the incumbent fluid. In yet another embodiment, the volume resistivity of the new fluid is no more than three orders of magnitude lower. Electrical properties of some of the fluids described are summarized in Table 1, below.

In another embodiment, the cable losses observed with the new fluid are equivalent to those in air, and those of the incumbent fluids.

TABLE 1

VOLUME RESISTIVITY AND BREAKDOWN VOLTAGE

| Tradename | Formula | Normal Boiling Point (° C.) | Dielectric Constant ASTM D924 | Volume Resistivity (Ohm-cm) ASTM D1169 | Breakdown Voltage ASTM D877 (in kV per 0.1" gap) | GWP |
|---|---|---|---|---|---|---|
| 1,1,1,2,2,5,5,6,6-decafluoro-3-hexene, (HFO-153-10mczz) | $CF_3CF_2CH=CHCF_2CF_3$ (E-F22E) | 48.8 | 1.82 | $5.1 \times 10^{14}$ | 42.7 | <20 |
| 1,1,1,4,5,5,5-heptafluoro-4-trifluoromethyl-2-pentene,(HFO-153-10mzzy) | $CF_3CH=CHCF(CF_3)_2$ (E-F13iE) | 49.5 | 1.84 | $9.2 \times 10^{12}$ | 36.7 | <20 |
| E-1,1,1,4,4,5,5,5-octafluoro-2-pentene (HFO-1438mzz) | $CF_3CH=CHCF_2CF_3$ (E-F12E) | 29.1 | 1.83 | $6.5 \times 10^{13}$ | TBD | <20 |
| E-1,1,1,4,4,5,5,6,6-decafluoro-2-hexene (HFO-153-10mzz) | $CF_3CH=CHCF_2CF_2CF_3$ (E-F13E) | 49.5 | 2.09 | $6.3 \times 10^{12}$ | TBD | <20 |

TABLE 1-continued

VOLUME RESISTIVITY AND BREAKDOWN VOLTAGE

| Tradename | Formula | Normal Boiling Point (° C.) | Dielectric Constant ASTM D924 | Volume Resistivity (Ohm-cm) ASTM D1169 | Breakdown Voltage ASTM D877 (in kV per 0.1" gap) | GWP |
|---|---|---|---|---|---|---|
| Novec-649 | | 49.0 | 1.80 | $1.8 \times 10^{12}$ | >40 | 1 |
| E-1,1,1,4,4,4-hexafluoro-2-butene HFO-E-1336mzz | $CF_3CH{=}CHCF_3$ (E-F11E) | 7.9 | 1.88 | $5.8 \times 10^{13}$ | 27.4 | <20 |
| FC-72 | | 56.0 | 1.80 | $1.0 \times 10^{15}$ | >40 | |
| FC-3284 | | 50.0 | 1.90 | $1.0 \times 10^{15}$ | >40 | |

From the properties in Table 1, it can be seen that HFO's F-22E, F13E and F13iE have similar boiling points and similar dielectric constants (<2.5) compared to the incumbent fluids Novec 649, FC-72 and FC-3284 but have significantly lower GWP than FC-72 and FC-3284, and much greater hydrolytic stability than Novec 649.

Even though HFO's E-F22E, E-F13iE and E-F13E each have dielectric constants less than 2.5, E-F22E clearly and unexpectedly has superior volume resistivity compared to the other HFO's, and is comparable to the PFC fluids FC-72 and FC-3284, indicating it would be an excellent candidate to replace those fluids without requiring any component changes. The breakdown voltage of E-F22E is also seen to be about 15% higher than that for E-F13iE, and the breakdown voltage for E-F22E is equivalent to that for the incumbent fluids as well. The take-away here is that even though the HFOs above all have a dielectric constant <2.5, there is a clear and unexpected distinction among them with E-F22E having superior breakdown voltage and volume resistivity compared to other HFO's, and it is either equivalent or superior to at least three known incumbent fluids while having similar normal boiling point, much lower GWP (compared to FCs) and superior hydrolytic stability (compared to Novec 649).

Dielectric constant and loss tangent (dissipation factor) of HFOs and incumbent fluids were also experimentally characterized using a Rohde and Schwarz ZVA-67 Vector Network Analyzer. The calibration kit was a Rohde and Schwarz ZN-Z218. Five test samples of each fluid using 2 separate measurement calibrations have been evaluated. Results are summarized in Table 2, below.

All the fluids in the table above have low and very similar dielectric constants throughout a wide range of frequency. E-F22E however was found surprisingly to have about an order of magnitude lower loss tangent value than either of E-F13iE or E-F13E, which should indicate improved results for signal integrity (lower signal losses). The value for loss tangent for E-F22E was also surprisingly equal to or better than that for the incumbent fluids FC-72 and Novec 649, indicating it could be used interchangeably. It should also be noted that the loss tangent value for E-F13iE is also equal to or lower (better) than Novec 649 over the range of frequencies tested. Results are in Table 3 below.

Cable loss evaluations were carried on a 1-inch segment of a 100 Ohm Differential Pair Cable in CST Microwave Studio using experimentally determined dielectric constant and loss tangent (dissipation factor) for multiple fluids at frequencies up to about 70 GHz. Results in dB loss per inch of cable are shown in the table below. One can also assume a fixed cable loss budget of 2, 5, 10 or 20 dB and obtain the correspondent maximum cable length. Results are shown in tables 4 and 5 below for 28 and 70 GHz

TABLE 3

Cable losses in dB/in at different frequencies

| | Actual losses in dB/in | | | % Losses compared to air | | |
|---|---|---|---|---|---|---|
| | Frequency | | | | | |
| | 10 Ghz | 28 GHz | 70 GHz | 10 Ghz | 28 GHz | 70 GHz |
| air | 0.108 | 0.237 | 0.543 | 0% | 0% | 0% |
| E-F22E | 0.111 | 0.244 | 0.547 | 3% | 3% | 1% |
| E-F13iE | 0.123 | 0.272 | 0.629 | 14% | 15% | 16% |
| E-F13E | 0.124 | 0.275 | 0.638 | 15% | 16% | 17% |

TABLE 2

| | 3 GHZ | | 10 GHZ | | 28 GHZ | | 67 GHz | |
|---|---|---|---|---|---|---|---|---|
| | Dielectric Constant | Loss Tangent | Dielectric Constant | Loss Tangent | Dielectric Constant | Loss Tangent | Dielectric Constant | Loss Tangent |
| E-F22E | 1.74 | $7.7 \times 10^{-4}$ | 1.74 | $7.8 \times 10^{-4}$ | 1.74 | $7.9 \times 10^{-4}$ | 1.74 | $8.0 \times 10^{-4}$ |
| E-F13iE | 1.75 | $7.6 \times 10^{-3}$ | 1.75 | $7.6 \times 10^{-3}$ | 1.73 | $7.8 \times 10^{-3}$ | 1.72 | $7.9 \times 10^{-3}$ |
| E-F13E | 1.77 | $8.3 \times 10^{-3}$ | 1.76 | $8.4 \times 10^{-3}$ | 1.75 | $8.5 \times 10^{-3}$ | 1.74 | $8.6 \times 10^{-3}$ |
| Novec 649 | 1.71 | $8.6 \times 10^{-3}$ | 1.70 | $8.8 \times 10^{-3}$ | 1.69 | $9.0 \times 10^{-3}$ | 1.38 | $9.2 \times 10^{-3}$ |
| FC-72 | 1.66 | $1.2 \times 10^{-3}$ | 1.66 | $1.3 \times 10^{-3}$ | 1.66 | $1.3 \times 10^{-3}$ | 1.66 | $1.3 \times 10^{-3}$ |

TABLE 3-continued

Cable losses in dB/in at different frequencies

|  | Actual losses in dB/in | | | % Losses compared to air | | |
|---|---|---|---|---|---|---|
|  | Frequency | | | | | |
|  | 10 Ghz | 28 GHz | 70 GHz | 10 Ghz | 28 GHz | 70 GHz |
| Novec-649 | 0.111 | 0.242 | 0.548 | 3% | 2% | 1% |
| FC72 | 0.113 | 0.244 | 0.553 | 5% | 3% | 2% |

TABLE 4

Differential Cable Length (inches) vs. Cable Loss Budget (in dB) at 70 GHz

|  | Cable Loss Budget | | | |
|---|---|---|---|---|
|  | 2 dB | 5 dB | 10 dB | 20 dB |
| Air | 3.7 | 9.2 | 18.4 | 36.8 |
| E-F22E | 3.7 | 9.1 | 18.3 | 36.6 |
| E-F13iE | 3.2 | 7.9 | 15.9 | 31.8 |
| E-F13E | 3.1 | 7.8 | 15.7 | 31.3 |
| Novec-649 | 3.6 | 9.1 | 18.2 | 36.5 |
| FC-72 | 3.6 | 9.0 | 18.1 | 36.2 |

TABLE 5

Differential Cable Length (inches) vs. Cable Loss Budget (in dB) at 28 GHz

|  | Cable Loss Budget | | | |
|---|---|---|---|---|
|  | 2 dB | 5 dB | 10 dB | 20 dB |
| Air | 8.4 | 21.1 | 42.2 | 84.4 |
| E-F22E | 8.2 | 20.5 | 41.0 | 82.0 |
| E-F13iE | 7.4 | 18.4 | 36.8 | 73.5 |
| E-F13E | 7.3 | 18.2 | 36.4 | 72.7 |
| N-649 | 8.3 | 20.7 | 41.3 | 82.6 |
| FC-72 | 8.2 | 20.5 | 41.0 | 82.0 |

Even though, all fluids (except air) have very similar dielectric constant (<2.5), cable losses are surprisingly 14-17% lower for E-F22E than other HFOs such as E-F13iE and E-F13E, similar to incumbents Novec-649 and FC-72 and also very close to a baseline medium of air for which cables are traditionally designed for.

The same conclusion can be made from data related cable length, in which one can clearly see the unexpected advantage of E-F22E compared E-F13iE and E-F13E by enabling the use of longer cables for the same budget due to lower losses per inch.

Another characteristic of a good working fluid is that it possesses a high-volume resistivity. Volume resistivity is an intrinsic property which measures how strongly a material resists electric current per unit length of a unit cross section, typically expressed in units of ohm-cm or ohm-m. A higher volume resistivity means the material is a better electrical insulator. The electrical resistance of material can be calculated by multiplying volume resistivity by the length and dividing by the cross-sectional area of the material.

So, a higher volume resistivity dielectric fluid is desirable as it leads to a higher electrical resistance and, consequently, a lower current leakage. Current leakage, for instance, can lead to self-discharge of energy storage devices such as batteries. It also means electrical components with different voltage can be placed closer for a given minimum resistance requirement, potentially leading to more compact assemblies. In one embodiment effective working fluids have a volume resistivity, measured at 25° C. of at least $1\times10^{12}$ ohm-cm. In another embodiment, an effective working fluid has a volume resistivity of at least $1\times10^3$ ohm-cm. In yet another embodiment, an effective working fluid has a volume resistivity of at least $1\times10^{14}$ ohm-cm. Water is known for having much lower volume resistivity. Thus, fluids with high volume resistivity are also desirable as, in case of the presence of water in the fluid, they would still maintain adequate levels of actual volume resistivity.

In one embodiment the volume resistivity of the new low-GWP fluid must be higher than about $1.0\times10^{13}$ ohm cm. In another embodiment, the volume resistivity is no more than about one order of magnitude lower than the high-GWP fluid being replaced. In yet another embodiment, the volume resistivity is no more than about two orders of magnitude.

Another important dielectric fluid property is the dielectric strength which is defined as the maximum electric field or voltage, per unit of length, a material can resist without undergoing electrical breakdown and becoming electrically conductive. It is typically measured in units of kV/mm or kV/0.1" gap. For a given distance or "gap", the voltage at which a material becomes electrically conductive is called the breakdown voltage. A higher dielectric strength material is advantageous since it allows a higher voltage between two conductors or it allows two conductors to be placed closer, leading to potentially more compact assemblies. In one embodiment, the dielectric strength is greater than about 30 kV/0.1" gap. In another embodiment, the dielectric strength is greater than about 35 kV/0.1" gap. In yet another embodiment, the dielectric strength is greater than about 40 kV/0.1" gap.

In one embodiment the dielectric strength of the new low-GWP fluid must be no more than about 10% lower than that of the high-GWP being replaced. In another embodiment, the dielectric strength of the new low-GWP fluid is no more than about 20% lower than that of the high GWP fluid.

Dielectric loss tangent, sometimes called a dissipation factor, is another critical dielectric property particularly in high frequencies due to its impact on signal attenuation or signal loss. It is defined with the tan(S), which is the ration of the imaginary component to the relative real component of the permittivity. It is also a measure of the rate at which energy carried by the electromagnetic field (RF) traveling through a dielectric is absorbed by that dielectric, i.e., it quantifies the dissipation of electromagnetic energy in the form of heat. Furthermore, the loss tangent is highly dependent on frequency and can increase particularly above frequencies of 1 GHz which can be found in applications such as data center servers, 5G and Wi-fi technology. More importantly, the signal loss or attenuation per unit length, typically measured in terms of dB/cm is a function of the loss tangent. In other words, for a signal travelling through a dielectric fluid, the higher the loss tangent of the fluid, the higher the signal loss per unit length and consequently the shorter the distance it can travel. Thus, it is very desirable that dielectric fluids have low loss tangent values in frequencies above 1 GHz to up to about 100 GHz. The fluids discovered by the inventors have shown very favorable values of loss tangent at high frequencies. In one embodiment, the loss tangent values of the dielectric fluids are less than $5\times10^{-3}$ at frequencies above 1 GHz. In another embodiment, the loss tangent values are less than $1\times10^{-3}$ at frequencies above 1 GHz. In yet another embodiment, the loss tangent values are less than $1\times10^{-3}$ at frequencies of from 1 GHz to 67 GHz.

The inventors have also discovered that the new proposed low-GWP fluids have equivalent and sometimes lower values of loss tangent compared to higher GWP fluids being replaced, particularly in high frequency.

All desirable dielectric properties aforementioned, high dielectric strength, low dielectric constant, low loss tangent and high-volume resistivity must be present primarily in the liquid phase but also in the vapor phase.

Other desirable characteristic of an immersion cooling fluid relates its ability of not significantly damaging, or not significantly reacting with, IT and computer parts such as cables, wires, seals, metals, among other parts, as well as constructions materials of the tank which are exposed to the dielectric fluid.

It is also desirable that these fluids have similar interactions with electronic components compared to the existing fluids so to minimize the replacement of parts.

Contaminant control measures, such as filter system, may be used to remove solid or liquid residues that may be generated as a result of reactivity with materials of construction or extraction of chemicals from materials of construction. Contamination control measures can also be used to maintain low enough acid and water levels.

Typical non-condensable gases, such nitrogen and oxygen, can also be present in the dielectric fluid and can be detrimental to boiling and condensation heat transfer. Thus, systems with dielectric two-phase fluids may be equipped with a supplemental device that at least partially removes or controls the level of non-condensable levels in the dielectric fluid.

The ability of the working fluid 140 to transport heat is related to the heat of vaporization of the dielectric working fluid 140. Typically, the greater the heat of vaporization of the dielectric working fluids 140, the greater amount of energy that the working fluid 140 will absorb during vaporization and transport to the condensing coil 150 to be released during condensation.

It is also desirable that these fluids are non-flammable or present no flash point. Standards such as ASTM D56, D1310, D92, D93 and E681 can be used to assess flammability.

Since the objective of these fluids is to remove heat from energy storage devices, one important consideration is how good of a two-phase heat transfer the dielectric fluid is. More specifically, how good of a heat transfer these fluids are under pool boiling conditions. Pool boiling heat transfer is typically divided into different modes or regimes:

1) Free convection: happens at small values of "wall superheat" or "excess temperature"—the difference between saturation temperature of the fluid and the wall or surface temperature
2) Nucleate boiling: occurs when there is high enough superheat for bubbles to form and separate from the surface, significantly improving heat transfer coefficient and heat flux. This mode is typically the preferred regime of boiling operation for heat removal. The nucleation boiling region is limited by the Critical Heat Flux (CHF) with units of kW/m$^2$. Heat transfer devices are usually designed to operate at heat fluxes lower than the CHF. The critical heat flux is particular to each fluid and depends on several thermophysical properties. It can be experimentally measured or estimated through semi-empirical models such as the one by Zuber (1959). Fluids with higher CHFs are desirable because they can remove more heat per unit of area, for a given wall superheat.
3) Transition boiling: a vapor film begins to form in the surface and there is an oscillation between nucleate and film boiling. The regime is unstable and not desirable to operate.
4) Film boiling: In this region the wall superheat is so high that a vapor blanket forms between the liquid and the surface—significantly reducing heat transfer coefficients. This region is also not desirable to operate.

Figure 3:
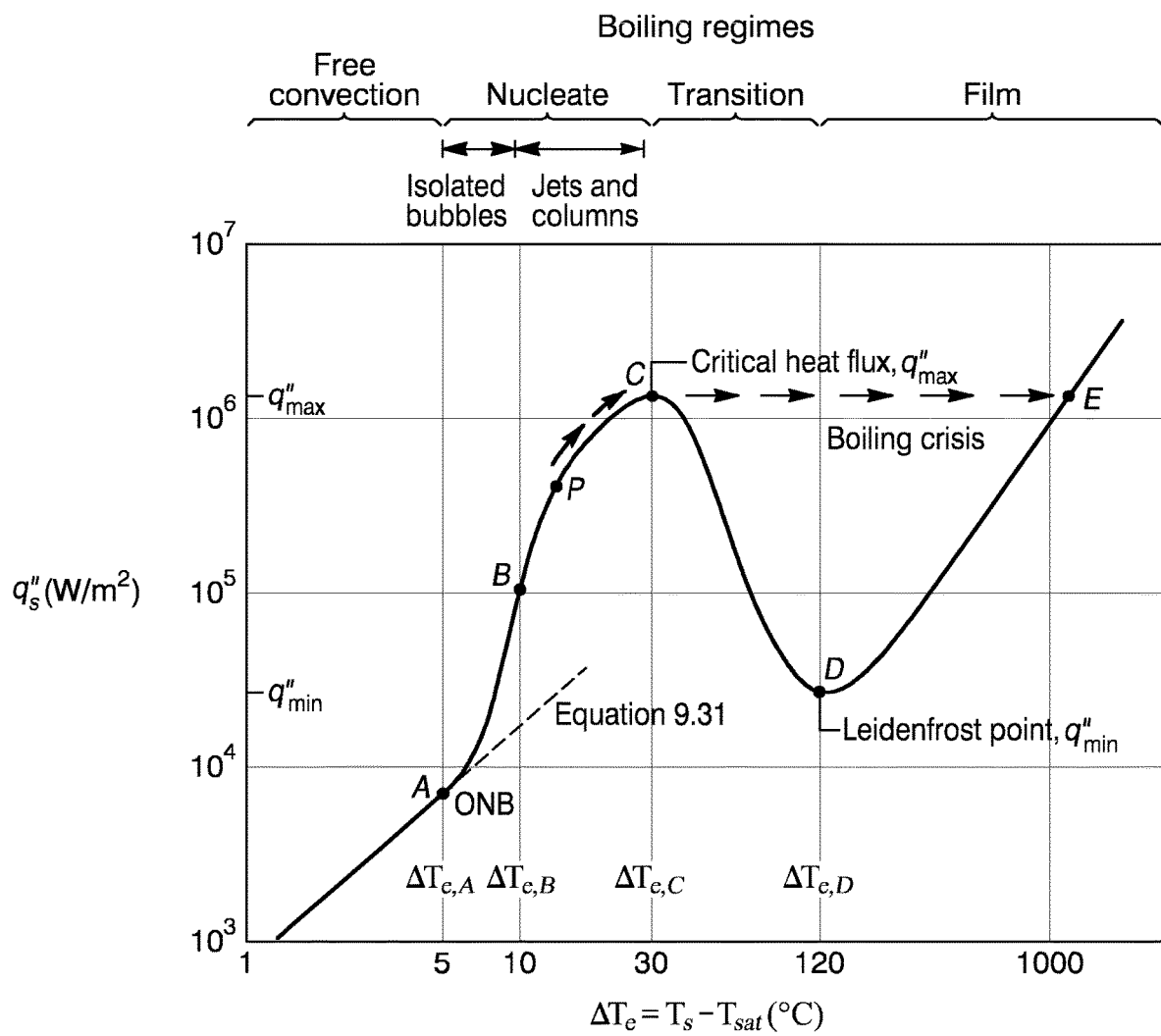
FIG. 3 is a pool boiling curve.

These regimes are illustrated in FIG. 3.

TABLE 6

Critical Heat Flux of Working Fluids calculated at sea level atmospheric pressures (101.325 kPa)

| Working Fluid | Critical Heat Flux (kW/m$^2$) |
| --- | --- |
| HFO-153-10mczz | 170 |
| HFO-153-10mzzy | 178 |
| Novec 649 | |
| 3M Novec ™ 7000 | 202 |
| 3M Novec ™ 7100 | 193 |
| 3M Novec ™ 7200 | 179 |
| FC-72 | 154 |

Table 6 shows that the HFOs proposed have comparable and sometimes higher CHFs than legacy fluids. The CHFs were obtained using Zuber (1958) correlation at sea level atmospheric pressure (101.325 kPa) while thermophysical properties were determined through REFPROP 10. Another aspect of boiling heat transfer is the heat transfer coefficient in the nucleate boiling region. It is measured in terms of heat removed (in units of "Watts" for instance), per unit of area (in units of "cm$^2$" for instance), per unit of temperature difference between the surface and the bulk fluid (in units of "Kelvin" for instance).

In one embodiment, it is highly desirable that the new low GWP fluids provide an equivalent or higher critical heat flux than the higher GWP fluids they are replacing. In another embodiment, the new low GWP fluids should provide a critical heat flux of no less than 90%. In yet another embodiment, the new low GWP fluid should provide a critical heat flux of no less than 80% of that of high GWP fluids so that there are no significant changes to the maximum heat flux dissipation in an existing immersion cooling system or major design changes to immersion cooling systems designed for higher GWP fluids.

A higher boiling heat transfer coefficient is desirable as it leads to a lower overall thermal resistance, or a lower temperature of the electrical component being cooled. The boiling heat transfer coefficient and the electrical component-to-fluid thermal resistance can be improved with the use of surface enhancements which increase the number of nucleation sites.

The electrical component-to-fluid thermal resistance can be determined by the inverse of the product between boiling heat transfer coefficient and the heat transfer area of the electronic/electrical component.

In one embodiment, the electrical component-to-fluid thermal resistance of the new fluids must be lower or equivalent compared to the existing high GWP fluid. In another embodiment, the electrical component-to-fluid thermal resistance of the new fluids must be no more than 10% higher than that of the existing high GWP fluid than that of the existing high GWP fluid. In yet another embodiment, the electrical component-to-fluid thermal resistance of the new fluids must be no more than 20% higher than that of the existing high GWP fluid, so there is no significant increase in temperature of an existing electronic device or no significant mechanical changes have to be implemented in a system design for a high GWP fluid.

Another important aspect of fluids used in two-phase immersion cooling systems is its condensation heat transfer coefficient. Higher condensation heat transfer are desirable as they lead to reduced vapor-to-condenser surface thermal resistance or lower temperature difference between the condensing vapor and the coolant that removes the heat. Condensation heat transfer can also be improved with surface enhancements.

The vapor-to-condenser surface thermal resistance can be determined by the inverse of the product between condensation heat transfer coefficient and the heat transfer area of the condenser.

In one embodiment, the vapor-to-condenser thermal resistance of the new fluids must be lower or equivalent compared to the existing high GWP fluid. In another embodiment, the vapor-to-condenser thermal resistance of the new fluids must be no more than 10% higher compared to the existing high GWP fluid. In yet another embodiment, the vapor-to-condenser thermal resistance of the new fluids must be no more than 20% higher compared to the existing high GWP fluid, so there is no significant drop in condenser performance or no significant mechanical changes, for instance an increase in heat transfer area, have to be implemented in the condenser designed for a high GWP fluid.

Combined higher boiling and condensation heat transfer coefficients are highly desirable as they reduce the overall thermal resistance between the coolant and the electronic or electrical equipment and reduce the temperature difference between the two. Better heat transfer coefficients yield better heat removal which, for instance, can allow batteries immersed in a dielectric liquid to be charged at a faster rate without leading to potential thermal runaway.

Heat transfer coefficients can be experimentally measured or calculated using experimentally determined heat transfer correlations combined with experimentally determined thermophysical properties.

TABLE 7

Heat transfer coefficients and temperature difference at sea level atmospheric pressure

| | Electronic Surface to Fluid Thermal Resistance K/W | Vapor to Condenser Surface Thermal Resistance K/kW |
|---|---|---|
| HFO-153-10mczz | 0.59 | 3.4 |
| HFO-153-10mzzy | 0.55 | 3.5 |
| Novec 7000 | 0.50 | 3.1 |
| Novec 7100 | 0.56 | 3.2 |
| Novec 7200 | 0.55 | 3.4 |
| FC-72 | 0.59 | 3.6 |
| FC-3284 | 0.57 | — |

In Table 7, the Electronic Surface-to-Fluid Thermal Resistance was determined by the inverse of the product between the pool boiling heat transfer coefficient and an electronic surface heat transfer area of 4 $cm^2$. The pool boiling heat transfer coefficient was obtained using Cooper (1984) correlation for nucleate boiling at sea level atmospheric pressures, with roughness of 1 micro-meter and a heat flux of 100 $kW/m^2$. The vapor-to-condenser surface thermal resistance was determined by the inverse of the product of the condensation heat transfer coefficient and a condenser surface area of 0.2 $m^2$. The condensation heat transfer coefficient was obtained using Dhir and Lienhard (1971) correlation for external condensation on tube bundles at sea level atmospheric pressures and a temperature difference between the bulk fluid and the condenser surface of 8 K.

Table 7 shows that the dielectric fluids claimed have equivalent heat transfer coefficients and temperature differences than legacy high-GWP fluids.

The power usage or efficiency of data centers can be quantified in terms of PUE—Power Utilization Effectiveness. The lower the PUE or the closer to 1.0, the lower the energy utilized to remove a given amount of heat from data centers. It is highly desirable that immersion tanks with dielectric fluids lead to operate at PUE values close to 1.0. The PUE of an immersion cooling tank can be obtained by measuring the overall energy dissipated by the immersed electronic equipment and the energy consumed by the tank. Due to equivalent dielectric, thermodynamic and heat transfer properties, the fluids proposed can also be used to replace the legacy high-GWP fluids in existing equipment in a practice often called "retrofit". The retrofit could be partial when only a percentage of the existing fluid is replaced or full, when the entire fluid is replaced with a new low GWP fluid.

Figure 2:
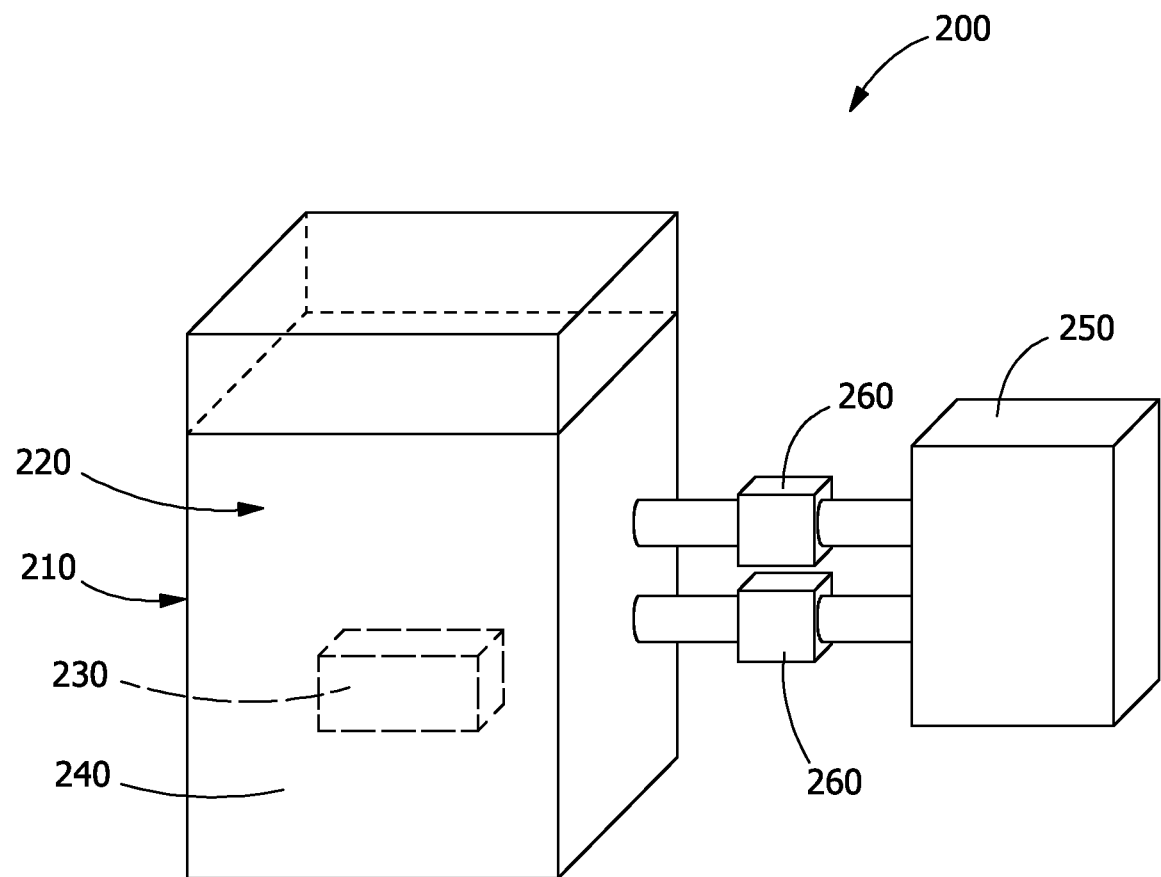
FIG. 2 is a perspective view of an immersion unit, according to an embodiment.

An embodiment of an immersion cooling unit 200 is shown in FIG. 2. The immersion cooling system 200 includes an immersion cell 210 defining an internal cavity 220. An energy storage device 230, to be cooled, may be placed in the internal cavity 220. A dielectric working fluid 240 partially fills the internal cavity 220. The dielectric working fluid 240 at least partially immerses the energy storage device 230. In some embodiments, the dielectric working fluid 240 substantially immerses the energy storage device 230. In one embodiment, the dielectric working fluid 240 completely immerses the energy storage device 230. A cooling unit 250 is positioned externally to the immersion cell 210. The cooling unit 250 is fluidly connected to the immersion cell 210. The cooling unit 250 is configured to fluidly receive at least a portion of the dielectric working fluid 240 from the immersion cell 210. The cooling unit 250 is further configured to extract heat from the dielectric working fluid 240, thereby reducing the temperature of the dielectric working fluid 240. In one embodiment, the cooling unit 250 includes a heat exchanger. In one embodiment, the heat transferred to the cooling unit 250 is released into the environment. The cooling unit 250 is further configured to return the cooled dielectric working fluid 240 to the immersion cooling cell 210. In some embodiments, a motive force may be provided to the dielectric working fluid 240. In one embodiment, the motive force may be provided by one or more circulation pumps 260. In one embodiment, the motive force may be provided by convective flow.

The dielectric working fluids of the immersion cooler 200 are selected to be in the liquid state over the operational temperature range of the immersion cooler 200. In some embodiments, the composition of the dielectric working fluids 240 includes one or more fluorinated compounds. In some embodiments, the dielectric working fluids 240 include one or more compounds including both fluorine and chlorine. In some embodiments, the operational temperature is at least 25° C., at least 30° C., at least 40° C., at least 50° C., at least 60° C., less than 100° C., less than 90° C., less than 80° C., less than 70° C., and combinations thereof.

Due to equivalent dielectric, thermodynamic and heat transfer properties, the fluids proposed can also be used to replace the legacy high-GWP fluids in existing equipment in a practice often called "retrofit".

From a practical perspective, liquid water is pushed up into the headspace of the device during startup and operation of the system. The presence of water in the cooling system (particularly in the headspace) is undesirable. It may contribute to corrosion of metal components in the headspace of the system. It may contribute to corrosion of metal components in the headspace of the system. The presence of water in the dielectric fluid can be detrimental to its dielectric properties since water has significantly lower resistivity ($5\times10^5$ ohm cm for distilled water).

While the invention has been described with reference to one or more embodiments, it will be understood by those skilled in the art that various changes may be made, and equivalents may be substituted for elements thereof without departing from the scope of the invention. In addition, many modifications may be made to adapt a particular situation or material to the teachings of the invention without departing from the essential scope thereof. Therefore, it is intended that the invention is not limited to the particular embodiments disclosed as the best mode contemplated for carrying out this invention, but that the invention will include all embodiments falling within the scope of the appended claims. In addition, all numerical values identified in the detailed description shall be interpreted as though the precise and approximate values are both expressly identified.

EXAMPLES

Samples of 1,1,1,2,2,5,5,6,6,6-decafluoro-3-hexene, and 1,1,1,4,5,5,5-heptafluoro-4-trifluoromethyl-2-pentene were prepared as described in U.S. Pat. No. 8,222,195. After distillation, dielectric constants were measured according to ASTM D924 at 25° C. at 1 KHz. Volume resistivity was measured according to ASTM D1169 at 25° C. at 500 VDC. The dielectric strength was measured according to ASTM D877. Dielectric constant, dielectric strength and volume resistivity were determined for the liquid phase. Results are summarized in Table 8, below. It can be seen that HFO-153-10mczz and HFO-153-10mzzy have superior dielectric properties; higher volume resistivity, higher dielectric strength and lower dielectric constant than Novec 7000, 7100 and 7200. The mixtures of HFO-153-10mczz and HFO-153-10mzzy also have superior volume resistivity and dielectric constant than Novec 7000, 7100 and 7200. They also have equivalent volume resistivity, dielectric strength and dielectric constant compared to significantly higher GWP fluids such as FC-3284, FC-72 and HT-55.

Other Embodiments

1. An immersion cooling unit comprising:
an immersion cell, defining an internal cavity;
i) an electrical component in the internal cavity;
ii) a dielectric working fluid partially filling the internal cavity;
iii) a condensing coil, positioned in the internal cavity above the electrical component;
wherein the dielectric working fluid at least partially immerses the electrical component; and
wherein the dielectric working fluid comprises at least one of: 1,1,1,2,2,5,5,6,6,6-decafluoro-3-hexene, (HFO-153-10mczz) and 1,1,1,4,5,5,5-heptafluoro-4-trifluoromethyl-2-pentene, (HFO-153-10mzzy).

2. The immersion cooling unit of embodiment 1, wherein working fluid consists essentially of at least one of 1,1,1,2,2,5,5,6,6,6-decafluoro-3-hexene, (HFO-153-10mczz) and 1,1,1,4,5,5,5-heptafluoro-4-trifluoromethyl-2-pentene, (HFO-153-10mzzy).

3. The immersion cooling unit of embodiment 1, wherein the working fluid consists essentially of 1,1,1,2,2,5,5,6,6,6-decafluoro-3-hexene.

4. The immersion cooling unit of embodiment 1, wherein the volume resistivity of the dielectric working fluid is at least about $1\times10^{13}$ 0-cm.

5. The immersion cooling unit of embodiment 1, wherein the volume resistivity of the dielectric working fluid is at least $1\times10^{14}$ 0-cm.

6. The immersion cooling unit of embodiment 1, wherein the operating temperature range is between 40° C. and 65° C.

7. The immersion cooling unit of embodiment 1, wherein the operating temperature range is between 45° C. and 55° C.

8. The immersion cooling unit of embodiment 1, wherein the dielectric working fluid has a loss tangent value of less than $1.0\times10^3$ at frequencies of from 3 GHz to 67 GHz.

9. The immersion cooling unit of embodiment 1, wherein the dielectric working fluid has a global warming potential (GWP) of less than 50.

10. The immersion cooling unit of embodiment 1, wherein the electrical component is selected from the group consisting of, high-capacity energy storage devices, electronic devices-datacenter servers, insulated-gate bipolar transistor (IGBT) devices, telecommunication infrastruc-

TABLE 8

| | Working Fluid Properties | | | | | |
|---|---|---|---|---|---|---|
| Working fluid | Volume resistivity (Ohm-cm) ASTM D1169 | Boiling Pt ° C. at 760 mm Hg | Dielectric Constant ASTM D924 | Dielectric Strength in kV/0.1" gap ASTM D877 | GWP (AR-4) | GWP (AR-5) |
| HFO-153-10mczz | $5.1 \times 10^{14}$ | 48.8 | 1.82 | 42.7 | NA | <20 |
| HFO-153-10mzzy | $9.2 \times 10^{12}$ | 49.5 | 1.84 | 36.7 | NA | <20 |
| Novec ™ 7000 | $1.0 \times 10^8$ | 34 | 7.4 | >25 | 420 | 530 |
| Novec ™ 7100 | $1.0 \times 10^8$ | 61 | 7.4 | >25 | 297 | 420 |
| Novec ™ 7200 | $1.0 \times 10^8$ | 76 | 7.3 | >25 | 59 | 57 |
| FC-3284 | $1.0 \times 10^{15}$ | 50 | 1.9 | 40 | 9500 | |
| FC-72 | $1.0 \times 10^{15}$ | 56 | 1.8 | 38 | 9300 | 7910 |
| HT-55 | $1.0 \times 10^{15}$ | 55 | 1.86 | 40 | 10300 | 9700 | ture, military electronics, televisions (TVs), cell phones, monitors, drones, automotive batteries, powertrains for electric vehicles (EVs), power electronics, avionics devices, power devices and displays.

11. A method for cooling an electrical component comprising:
　at least partially immersing an electrical component in a working fluid; and
　transferring heat from the electrical component using the working fluid;
wherein the working fluid comprises at least one of: 1,1,1,2,2,5,5,6,6,6-decafluoro-3-hexene, (HFO-153-10mczz) and 1,1,1,4,5,5,5-heptafluoro-4-trifluoromethyl-2-pentene, (HFO-153-10mzzy).

12. The method of embodiment 11, wherein the working fluid consists essentially of at least one of 1,1,1,2,2,5,5,6,6,6-decafluoro-3-hexene, (HFO-153-10mczz) and 1,1,1,4,5,5,5-heptafluoro-4-trifluoromethyl-2-pentene, (HFO-153-10mzzy).

13. The method of embodiment 11, wherein the working fluid consists essentially of 1,1,1,2,2,5,5,6,6,6-decafluoro-3-hexene (HFO-153-10mczz).

14. The method of embodiment 11, where said transferring of heat occurs through pumping of said working fluid from the electrical component to be cooled to a remote heat sink.

15. The method of embodiment 11, where said transferring of heat occurs through vaporization of said working fluid in contact with the electrical component to be cooled, and condensing said working fluid vapor through contact with a heat sink.

16. The method of embodiment 11, wherein said working fluid has a global warming potential of less than 50.

17. The method of embodiment 11, wherein said working fluid has a volume resistivity of about $1\times10^{13}$ 0-cm.

18. The method of embodiment 11, wherein the dielectric working fluid has a loss tangent value of less than $1.0\times10^3$ at frequencies of from 3 GHz to 67 GHz.

19. The method of embodiment 11, wherein said electrical component is selected from the group consisting of, a high-capacity energy storage devices, electronic devices, datacenter servers, insulated-gate bipolar transistor (IGBT) devices, telecommunication infrastructure, military electronics, televisions (TVs), cell phones, monitors, drones, automotive batteries, powertrains for electric vehicles (EVs), power electronics, avionics devices, power devices and displays.

20. A method of replacing a high-GWP working fluid in an immersion cooling system, comprising:
　charging an immersion cooling system that was designed for use with a high GWP working fluid with a composition comprising at least one of 1,1,1,2,2,5,5,6,6,6-decafluoro-3-hexene, (HFO-153-10mczz), 1,1,1,4,5,5,5-heptafluoro-4-trifluoromethyl-2-pentene, (HFO-153-10mzzy.

21. The method of embodiment 20, wherein the thermal resistance of the external surface of the electrical component to the replacement fluid is lower than or equivalent to said high-GWP working fluid, 22. The method of embodiment 20, wherein the thermal resistance of the external surface of the electrical component to fluid thermal resistance of the replacement fluid is no higher than 20% greater than that of said high-GWP working fluid.

23. The method of embodiment 20, wherein the thermal resistance of the external surface of the electrical component to the replacement fluid is no higher than 10% greater than that of said high-GWP working fluid.

24. The method of embodiment 20, wherein the replacement fluid has a loss tangent value of less than $1.0\times10^3$ at frequencies of from 3 GHz to 67 GHz.

25. The method of embodiment 20, wherein the working fluid consists essentially of 1,1,1,2,2,5,5,6,6,6-decafluoro-3-hexene (HFO-153-10mczz).

What is claimed is:

1. An immersion cooling unit comprising:
　an immersion cell, defining an internal cavity;
　　i) an electrical component in the internal cavity;
　　ii) a dielectric working fluid partially filling the internal cavity;
　　iii) a condensing coil, positioned in the internal cavity above the electrical component;
　wherein the dielectric working fluid at least partially immerses the electrical component; and
　wherein the dielectric working fluid includes at least one of:
　　E-1,1,1,2,2,5,5,6,6,6-decafluoro-3-hexene, (HFO-153-10mczz) and E-1,1,1,4,5,5,5-heptafluoro-4-trifluoromethyl-2-pentene, (HFO-153-10mzzy).

2. The immersion cooling unit of claim 1, wherein the working fluid consists essentially of at least one of E-1,1,1,2,2,5,5,6,6,6-decafluoro-3-hexene (HFO-153-10mczz) and E-1,1,1,4,5,5,5-heptafluoro-4-trifluoromethyl-2-pentene (HFO-153-10mzzy).

3. The immersion cooling unit of claim 1, wherein the working fluid consists essentially of E-1,1,1,2,2,5,5,6,6,6-decafluoro-3-hexene.

4. The immersion cooling unit of claim 1, wherein the dielectric working fluid has a volume resistivity which is at least about $1\times10^{13}$ Ω-cm.

5. The immersion cooling unit of claim 1, wherein the dielectric working fluid has a volume resistivity which is at least about $1\times10^{14}$ Ω-cm.

6. The immersion cooling unit of claim 1, wherein the dielectric working fluid operates in a temperature range is between 40° C. and 65° C.

7. The immersion cooling unit of claim 1, wherein the dielectric working fluid operates in a operating temperature range is between 45° C. and 55° C.

8. The immersion cooling unit of claim 1, wherein the dielectric working fluid has a loss tangent value of less than $1.0\times10^{-3}$ at frequencies of from 3 GHz to 67 GHz.

9. The immersion cooling unit of claim 1, wherein the electrical component is selected from the group consisting of a high-capacity energy storage devices, electronic devices, datacenter servers, insulated-gate bipolar transistor (IGBT) devices, telecommunication infrastructure, military electronics, televisions (TVs), cell phones, monitors, drones, automotive batteries, powertrains for electric vehicles (EVs), power electronics, avionics devices, power devices and displays.

10. A method for cooling an electrical component comprising:
　at least partially immersing an electrical component in a working fluid; and
　transferring heat from the electrical component using the working fluid;
　wherein the working fluid comprises at least one of: 1,1,1,2,2,5,5,6,6,6-decafluoro-3-hexene, (HFO-153-10mczz) and 1,1,1,4,5,5,5-heptafluoro-4-trifluoromethyl-2-pentene, (HFO-153-10mzzy).

11. The method of claim 10, wherein the working fluid consists essentially of at least one of 1,1,1,2,2,5,5,6,6,6- decafluoro-3-hexene, (HFO-153-10mczz) and 1,1,1,4,5,5,5-heptafluoro-4-trifluoromethyl-2-pentene, (HFO-153-10mzzy).

12. The method of claim 10, wherein the working fluid consists essentially of 1,1,1,2,2,5,5,6,6,6-decafluoro-3-hexene (HFO-153-10mczz).

13. The method of claim 10, where said transferring of heat occurs through vaporization of said working fluid in contact with the electrical component to be cooled, and condensing said working fluid vapor through contact with a heat sink.

14. The method of claim 10, wherein said working fluid has a volume resistivity of about $1 \times 10^{13}$ Ω-cm.

15. The method of claim 10, wherein said electrical component is selected from the group consisting of a high-capacity energy storage devices, electronic devices-datacenter servers, insulated-gate bipolar transistor (IGBT) devices, telecommunication infrastructure, military electronics, televisions (TVs), cell phones, monitors, drones, automotive batteries, powertrains for electric vehicles (EVs), power electronics, avionics devices, power devices and displays.

16. A method of replacing a high-GWP dielectric fluid in an immersion cooling system, comprising:
charging an immersion cooling system, comprising an electrical component, that was designed for use with a high-GWP working fluid with a composition comprising at least one of 1,1,1,2,2,5,5,6,6,6-decafluoro-3-hexene, (HFO-153-10mczz), 1,1,1,4,5,5,5-heptafluoro-4-trifluoromethyl-2-pentene, (HFO-153-10mzzy).

17. The method of claim 16, wherein the electrical component to fluid thermal resistance of the replacement fluid is lower than or equivalent to said perfluorinated working fluid or high GWP fluid.

18. The method of claim 16, wherein the electrical component to fluid thermal resistance of the replacement fluid is no higher than 20% greater than that of said perfluorinated working fluid or high GWP fluid.

19. The method of claim 16, wherein the electrical component to fluid thermal resistance of the replacement fluid is no higher than 10% greater than that of said perfluorinated working fluid or high GWP fluid.

20. The method of claim 16, wherein the working fluid consists essentially of 1,1,1,2,2,5,5,6,6,6-decafluoro-3-hexene (HFO-153-10mczz).

* * * * *